US011917355B2

United States Patent
Harjee et al.

(10) Patent No.: US 11,917,355 B2
(45) Date of Patent: *Feb. 27, 2024

(54) FORCE-ACTIVATED EARPHONE

(71) Applicant: Apple Inc., Cupertino, CA (US)

(72) Inventors: Nahid Harjee, Sunnyvale, CA (US); Brian R. Twehues, Campbell, CA (US); Teera Songatikamas, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/897,152

(22) Filed: Aug. 27, 2022

(65) Prior Publication Data

US 2022/0417643 A1  Dec. 29, 2022

Related U.S. Application Data

(63) Continuation of application No. 17/351,133, filed on Jun. 17, 2021, now Pat. No. 11,463,799, which is a
(Continued)

(51) Int. Cl.
  *H04R 1/10* (2006.01)
  *G06F 3/044* (2006.01)
(52) U.S. Cl.
  CPC ........... *H04R 1/1041* (2013.01); *G06F 3/044* (2013.01); *H04R 1/1016* (2013.01); *H04R 1/1066* (2013.01); *G06F 2203/04104* (2013.01)
(58) Field of Classification Search
  CPC .. H04R 1/1041; H04R 1/1016; H04R 1/1066; H04R 2201/10; H04R 2460/00;
(Continued)

(56) References Cited

U.S. PATENT DOCUMENTS 6,456,720 B1 * 9/2002 Brimhall .............. H04R 25/658
  381/322
6,915,702 B2  7/2005 Omura et al.
(Continued)

FOREIGN PATENT DOCUMENTS

CN  202004935  10/2011
CN  203482367  3/2014
(Continued)

OTHER PUBLICATIONS

Screen captures from Longman Dictionary entitled "Flap". Retrieved from Internet: <https://www.ldoceonline.com/dictionary/flap> (Year: 2023).*

(Continued)

Primary Examiner — Angelica M McKinney
(74) Attorney, Agent, or Firm — Brownstein Hyatt Farber Schreck, LLP

(57) ABSTRACT

An earphone includes a housing that defines a force input surface opposite a touch input surface. A spring member in the housing includes a first arm that biases a touch sensor toward the touch input surface. The spring member also includes a second arm that biases a first force electrode toward the housing and allows the first force electrode to move toward a second force electrode when a force is applied to the force input surface. A non-binary amount of the force is determinable using a change in a mutual capacitance between the first force electrode and the second force electrode. The mutual capacitance between the first force electrode and the second force electrode may be measured upon detecting a touch using the touch sensor.

20 Claims, 16 Drawing Sheets

Related U.S. Application Data continuation of application No. 16/539,515, filed on Aug. 13, 2019, now Pat. No. 11,070,904.

(60) Provisional application No. 62/734,389, filed on Sep. 21, 2018.

(58) Field of Classification Search
CPC .................. H04R 1/1091; G06F 3/044; G06F 2203/04104; H03K 2017/9613; H03K 2217/96076; H03K 2217/960775; H03K 17/962; H03K 17/975; H03K 2217/96075
See application file for complete search history.

(56) References Cited

U.S. PATENT DOCUMENTS

| | | | |
|---|---|---|---|
| 7,538,760 B2 | 5/2009 | Hotelling et al. | |
| 7,791,476 B2 | 9/2010 | Hawkins et al. | |
| 7,925,029 B2 | 4/2011 | Hollemans | |
| 8,168,908 B2 | 5/2012 | Heimann | |
| 8,169,416 B2 | 5/2012 | Han | |
| 8,266,697 B2 | 9/2012 | Jones | |
| 8,331,603 B2 | 12/2012 | Martenson et al. | |
| 8,436,823 B2 | 5/2013 | Kanehira et al. | |
| 8,712,071 B2 | 4/2014 | Terlizzi et al. | |
| 8,735,755 B2 | 5/2014 | Peterson | |
| 8,780,074 B2 | 7/2014 | Castillo et al. | |
| 8,823,675 B2 | 9/2014 | Sleeman | |
| 8,824,712 B2 | 9/2014 | Sacha | |
| 8,885,851 B2 | 11/2014 | Westenbroek | |
| 8,988,384 B2 | 3/2015 | Krah et al. | |
| 9,118,990 B2 | 8/2015 | Hankey et al. | |
| 9,128,558 B2 | 9/2015 | Cok et al. | |
| 9,128,577 B2 | 9/2015 | Polishchuk | |
| 9,182,859 B2 | 11/2015 | Coulson et al. | |
| 9,223,445 B2 | 12/2015 | Sleeman et al. | |
| 9,563,317 B2 | 2/2017 | Sleeman et al. | |
| 9,590,680 B1 | 3/2017 | Reuss et al. | |
| 9,654,104 B2 | 5/2017 | Rothkopf et al. | |
| 9,671,898 B2 | 6/2017 | Hsieh et al. | |
| 9,712,905 B2 | 7/2017 | Zorkendorfer | |
| 9,729,971 B2 | 8/2017 | Hosoi et al. | |
| 9,769,558 B2 * | 9/2017 | Chandramohan | H04R 1/345 |
| 9,785,296 B2 | 10/2017 | Lee et al. | |
| 9,977,499 B2 | 5/2018 | Westerman et al. | |
| 10,117,012 B2 | 10/2018 | Saulsbury et al. | |
| 10,123,107 B2 | 11/2018 | Lin et al. | |
| 10,139,974 B2 | 11/2018 | Hong et al. | |
| 10,165,349 B2 | 12/2018 | Park et al. | |
| 10,231,045 B2 | 3/2019 | Lee et al. | |
| 10,291,975 B2 | 5/2019 | Howell et al. | |
| 10,379,574 B2 | 8/2019 | Kim | |
| 10,394,396 B2 | 8/2019 | Chiang et al. | |
| 10,534,468 B2 | 1/2020 | Chatterjee | |
| 10,545,543 B2 | 1/2020 | Fomin et al. | |
| 10,659,866 B2 | 5/2020 | Smith et al. | |
| 10,720,474 B2 | 7/2020 | Hwang et al. | |
| 10,728,646 B2 | 7/2020 | Mohammadi et al. | |
| 10,750,268 B2 | 8/2020 | Dang | |
| 10,757,491 B1 | 8/2020 | Jackson | |
| 10,918,901 B2 | 2/2021 | Orfield | |
| 10,999,667 B2 | 5/2021 | Yang | |
| 11,070,904 B2 * | 7/2021 | Harjee | H04R 1/1091 |
| 11,206,473 B2 | 12/2021 | Ji et al. | |
| 11,463,797 B2 * | 10/2022 | Harjee | G06F 3/044 |
| 11,463,799 B2 * | 10/2022 | Harjee | H04R 1/1091 |
| 11,743,623 B2 | 8/2023 | Jackson et al. | |
| 2008/0130910 A1 | 6/2008 | Jobling et al. | |
| 2008/0211383 A1 | 9/2008 | Deguchi et al. | |
| 2008/0260176 A1 | 10/2008 | Hollemans et al. | |
| 2011/0091059 A1 * | 4/2011 | Sacha | H04R 25/50 381/330 |
| 2011/0206215 A1 | 8/2011 | Bunk | |
| 2013/0082973 A1 | 4/2013 | Wurzel et al. | |
| 2015/0002452 A1 | 1/2015 | Klinghult | |
| 2015/0358716 A1 | 12/2015 | Zhu et al. | |
| 2016/0103544 A1 | 4/2016 | Filiz et al. | |
| 2019/0098390 A1 | 3/2019 | Carino et al. | |
| 2019/0297408 A1 * | 9/2019 | Mohammadi | H04R 1/1016 |
| 2020/0075272 A1 * | 3/2020 | Solis | H04R 1/1016 |
| 2020/0077176 A1 | 3/2020 | Powell et al. | |
| 2020/0249780 A1 * | 8/2020 | Zhou | G06F 3/04883 |
| 2020/0344536 A1 | 10/2020 | Jackson et al. | |
| 2021/0108973 A1 | 4/2021 | Sun | |
| 2021/0168487 A1 | 6/2021 | Harjee et al. | |
| 2021/0219042 A1 | 7/2021 | Harjee et al. | |
| 2021/0239544 A1 | 8/2021 | Chen et al. | |
| 2021/0314696 A1 | 10/2021 | Harjee et al. | |
| 2022/0417641 A1 | 12/2022 | Harjee et al. | |
| 2022/0417642 A1 | 12/2022 | Harjee et al. | |

FOREIGN PATENT DOCUMENTS

| | | |
|---|---|---|
| CN | 105190495 | 12/2015 |
| CN | 106210961 | 12/2016 |
| CN | 106851456 | 6/2017 |
| CN | 107682768 | 2/2018 |
| CN | 107728836 | 2/2018 |
| CN | 207321498 | 5/2018 |
| CN | 108174319 | 6/2018 |
| CN | 207560279 | 6/2018 |
| CN | 207560279 U * | 6/2018 |
| CN | 109976593 | 7/2019 |
| CN | 110267143 | 9/2019 |
| CN | 213958032 | 8/2021 |
| CN | 214591927 | 11/2021 |
| CN | 113810809 | 12/2021 |
| DE | 102020100391 | 7/2021 |
| JP | 2011134000 | 7/2011 |
| JP | 2004194591 | 10/2019 |
| KR | 2005200396651 | 9/2005 |
| KR | 100777383 | 11/2007 |
| WO | WO 06/129290 | 2/2006 |
| WO | WO 06/075275 | 7/2006 |
| WO | WO 07/049254 | 5/2007 |
| WO | WO 14/124173 | 8/2014 |
| WO | WO 17/105048 | 6/2017 |
| WO | WO 20/060725 | 3/2020 |
| WO | WO 22/036550 | 2/2022 |

OTHER PUBLICATIONS

Electronic Paper: "Pay homage to Huawei, NDS capacitive pressure sensing touch solution boosts freebud pro to go ahead," Oct. 1, 2020, Retrieved on Jan. 19, 2021 from: https://ee-paper.com/pay-homage-to-huawei-ndt-capacitive-pressure-sensing-touch-solution-boosts-freebud-pro-to-go-ahead/, 9 pages.

* cited by examiner

FORCE-ACTIVATED EARPHONE

CROSS-REFERENCE TO RELATED APPLICATIONS

This application is a continuation of U.S. patent application Ser. No. 17/351,133, filed Jun. 17, 2021, which is a continuation of U.S. patent application Ser. No. 16/539,515, filed Aug. 13, 2019, now U.S. Pat. No. 11,070,904, which is a nonprovisional of and claims the benefit under 35 U.S.C. § 119(e) of U.S. Provisional Patent Application No. 62/734,389, filed Sep. 21, 2018, the contents of which are incorporated herein by reference as if fully disclosed herein.

FIELD

The described embodiments relate generally to earphones. More particularly, the present embodiments relate to force-activated earphones.

BACKGROUND

Earphones are often used to provide audio output to users of electronic devices without overly disturbing people around them. For example, headsets for personal electronic devices (such as computing devices, digital media players, music players, transistor radios, and so on) typically include a pair of earphones. These earphones are usually configured with ear cups that go over the user's ears or with ear pieces or speakers that insert into the user's ear canal in order to form an acoustic chamber with the user's ear. The earphones typically produce acoustic waves that are transmitted into that acoustic chamber through one or more acoustic ports. In this way, the user can hear the audio output without overly disturbing people in the environment around the user.

Many such earphones include no input devices. Instead, such earphones may be controlled using input devices incorporated into external electronic devices to which the earphones may be wired or wirelessly coupled.

Other earphones may include one or more input devices. For example, earphones may be configured with one or more buttons, dials, switches, sliders, and so on. Such input devices may be used to activate (e.g., provide input to) the earphone.

SUMMARY

The present disclosure relates to force-activated electronic devices, such as earphones. A non-binary amount of a force applied to a force input surface defined by a housing of the earphone is determinable using a change in a mutual capacitance between first and second force electrodes. A spring member disposed within the housing biases the first force electrode towards the housing and allows it to move towards the second force electrode when the force is applied. In some implementations, the earphone may detect touch on a touch input surface defined by the housing. In various examples of such an implementation, the earphone may determine the non-binary amount of the force upon detection of the touch. In a particular embodiment, the first and second force electrodes may be implemented using separate sections of a single flexible circuit. This flexible circuit may flex to allow the first force electrode to move toward the second force electrode when the force is applied. This flexible circuit may also flex to allow the first force electrode to move away from the second force electrode when the force is no longer applied.

In various embodiments, an electronic device includes a housing defining a force input surface, a first force electrode disposed within the housing, a second force electrode disposed within the housing, a spring member biasing the first force electrode toward the housing and allowing the first force electrode to move toward the second force electrode when an input force is applied to the force input surface, and a controller. The controller is operative to determine a non-binary amount of the input force using a change in a capacitance between the first force electrode and the second force electrode.

In some examples, the electronic device further includes a touch sensor disposed within the housing. In some implementations of such examples, the housing defines a touch input surface and the spring member includes a first arm that biases the touch sensor toward the touch input surface and a second arm that biases the first force electrode toward the force input surface. In various examples, the capacitance is a mutual capacitance.

In various examples, the spring member is at least one of metal or plastic. In numerous examples, the spring member has an M-shaped cross section.

In some examples, the housing defines an additional force input surface. In some implementations of such examples, a third force electrode is disposed within the housing adjacent to the additional force input surface and a fourth force electrode is disposed within the housing. In such implementations, the controller is operative to determine the non-binary amount of the input force using the capacitance between the first force electrode and the second force electrode and an additional capacitance between the third force electrode and the fourth force electrode.

In numerous examples, the controller is operative to determine an additional force applied to an area of the housing other than the force input surface using an additional change in the capacitance between the first force electrode and the second force electrode. The area may be orthogonal to the force input surface and the additional change in the capacitance may be opposite the change in the capacitance.

In some embodiments, an earphone includes a housing, a spring member disposed within the housing that moves when a force is applied to the housing, a touch sensor coupled to the spring member that is configured to detect a touch on the housing, a force sensor coupled to the spring member, and a controller. The controller uses the force sensor and the touch sensor to determine an amount of the force.

In some examples, the touch is on a first area of the housing and the force is applied to a second area of the housing. In various such examples, the first area is located opposite the second area. In some such examples, the first area and the second area are both positioned approximately 90 degrees from a user's head during use of the earphone.

In various examples, the touch sensor is inoperable to detect touches on the second area. In some examples, the controller is operative to interpret the force as multiple different kinds of input.

In numerous embodiments, an earphone includes a housing, a flexible circuit disposed in the housing, and a controller disposed in the housing. The housing includes a speaker and a stem extending from the speaker and defining a touch input surface and a force input surface opposite the touch input surface. The flexible circuit includes a first circuitry section, a second circuitry section, and a third circuitry section. The flexible circuit flexes to allow the second circuitry section to move toward the third circuitry section when a force is applied to the force input surface and away from the third circuitry section when the force is no longer applied. The controller is operative to determine a touch to the touch input surface using a first change in a first mutual capacitance detected using the first circuitry section and a non-binary amount of the force using a second change in a second mutual capacitance detected using the second circuitry section and the third circuitry section.

In some examples, the controller uses the second circuitry section and the third circuitry section to determine the non-binary amount of the force upon determining the touch. In numerous examples, the earphone further includes an antenna disposed within the housing. The flexible circuit may be mounted to the antenna. In some examples, the speaker defines an acoustic port and the touch input surface and the force input surface are substantially orthogonal to the acoustic port.

In various examples, the controller determines an amount of time that the force is applied. In some examples, the controller interprets the force as a first input if the non-binary amount of the force is below a force threshold and a second input if the non-binary amount of the force at least meets the force threshold.

BRIEF DESCRIPTION OF THE DRAWINGS

The disclosure will be readily understood by the following detailed description in conjunction with the accompanying drawings, wherein like reference numerals designate like structural elements.

DETAILED DESCRIPTION

Figure 1A:
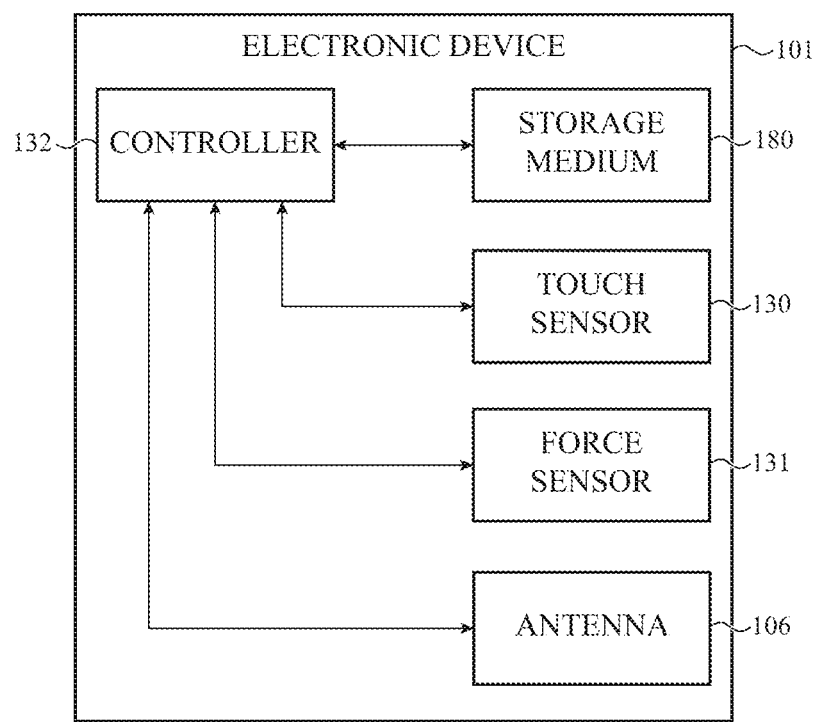
FIG. 1A depicts a block diagram illustrating example functional relationships between example components that may be implemented in an electronic device.

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

The description that follows includes sample systems, methods, apparatuses, and products that embody various elements of the present disclosure. However, it should be understood that the described disclosure may be practiced in a variety of forms in addition to those described herein.

Earphones that include mechanical input devices (such as buttons, dials, switches, sliders, and so on) disposed on, or accessible through, a housing surface may be challenging to operate as a user may not be able to see the mechanical input devices while the earphones are worn. Some earphones may attempt to solve this by using input mechanisms that detect one or more taps from a user. However, though a user may be able to activate (e.g., provide input to) the earphone more easily by tapping than by locating a button to press, tapping the earphone may conduct sound. This may be unpleasant to the user. This may also disrupt audio output produced by the earphone. Further, in implementations where the earphone includes one or more microphones, the tapping may be picked up by a microphone.

The following disclosure relates to force-activated electronic devices, such as earphones. Embodiments may estimate or determine non-binary amounts of force applied to a force input surface on a housing by measuring a change in capacitance between first and second force electrodes. A spring member within the housing biases the first force electrode towards the housing while allowing it to move towards the second force electrode when the force is applied. In this way, the earphone can be activated by a force without requiring or using external mechanical input devices and/or without tapping.

In some implementations, an earphone may detect a touch on a touch input surface of the housing. In some embodiments, the earphone may determine a non-binary amount of input force upon detection of the touch. In this way, the earphone may improve power usage over implementations where force determination is performed more frequently. For example, the earphone may be a battery powered device and the improved power usage may improve battery life. In other implementations, the earphone may use signals from both a touch sensor and a force sensor to determine applied force by only using force detected when a touch is also detected.

In a particular embodiment, the first and second force electrodes may be implemented as separate sections of a single flexible circuit. This flexible circuit may flex to allow the first force electrode to move toward the second force electrode when the force is applied. This flexible circuit may also flex to allow the first force electrode to move away from the second force electrode when the force is no longer applied.

In certain embodiments, an earphone may detect touch on a first side of a stem and force on the other side of the stem. The sides where touch and force are detected may be opposite and substantially orthogonal with respect to each other (oriented 180 degrees) such that a user may simultaneously contact both sides when squeezing the stem between the user's fingers. The earphone may determine a force and use the force if a touch is detected, potentially ignoring the determined force if a touch is not detected. In this way, the earphone may use the touch and force detection of the two sides together to control operation of the earphone.

In some examples, the two sides may be oriented substantially perpendicular (90 degrees) from the user's head or other body part when in use to prevent or mitigate interference between the user's head and one or more sensors used to detect touch and/or force. For example, this orientation may prevent the two sides from touching the user's head or face during use of the earphone. The user's head or face touching the two sides could be falsely interpreted as input. As such, this orientation may reduce false inputs by preventing the user's head or face from touching the two sides during use.

However, it is understood that this is an example. In various implementations, the sides may be configured in other arrangements. For example, the two sides may be positioned 45 degrees away from each other and respectively 135 degrees away from the user when the user is wearing the earphone.

These and other embodiments are discussed below with reference to FIGS. 1A-9. However, those skilled in the art will readily appreciate that the detailed description given herein with respect to these figures is for explanatory purposes only and should not be construed as limiting.

FIG. 1A depicts a block diagram illustrating example functional relationships between example components that may be used to implement an electronic device 101. The electronic device 101 may include a controller 132 that is operative to interpret various touches to and/or forces exerted upon the electronic device 101 as input. For example, the electronic device 101 may be an earphone with one or more input surfaces defined on a housing. The controller 132 may use one or more touch sensors 130 and/or force sensors 131 to detect touches on one or more of the input surfaces, force applied to one or more of the input surfaces, and so on. For example, the electronic device 101 may include one or more mutual capacitance touch sensors, self-capacitance touch sensors, mutual capacitance force sensors, self-capacitance force sensors, strain gauges, optical sensors, pressure sensors, proximity sensors, switches, temperature sensors, dome switches, displacement sensors, and so on.

Figure 1B:
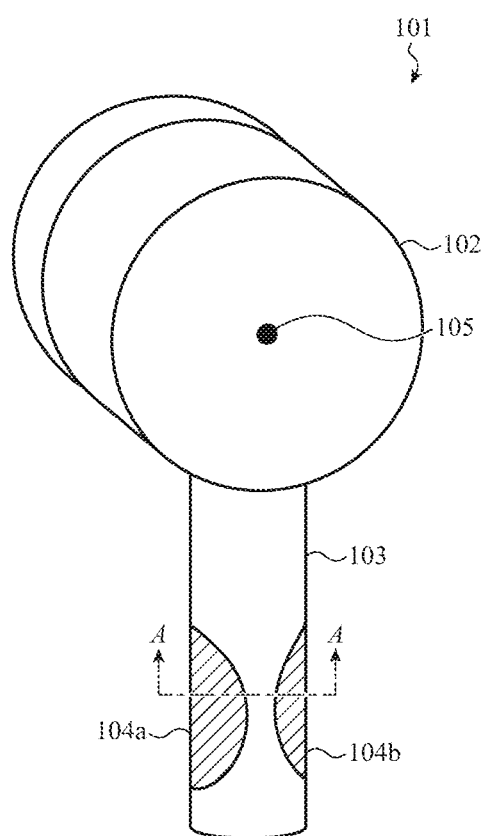
FIG. 1B depicts an example implementation of the electronic device of FIG. 1A.

The electronic device 101 may also include an antenna 106, one or more non-transitory storage media 180 (which may take the form of, but is not limited to, a magnetic storage medium; optical storage medium; magneto-optical storage medium; read only memory; random access memory; erasable programmable memory; flash memory; and so on), and/or one or more other components. The controller 132 may execute instructions stored in the non-transitory storage medium 180 to perform various functions, such as using the touch sensor 130 to detect touch, using the force sensor 131 to detect applied force, using the antenna 106 to communicate with an associated device, and so on FIG. 1B depicts an example implementation of the electronic device 101. As illustrated, in some implementations, the electronic device 101 may be an earphone. In this example, the electronic device 101 is a wireless earphone. However, it is understood that this is an example. In various implementations, the electronic device 101 may be any kind of electronic device, such as a mobile computing device, a stylus, and so on. Various configurations are possible and contemplated.

The electronic device 101 may include a housing including a speaker 102 and a stem 103. The stem 103 may define the input surfaces 104a, 104b. A user may be able to touch, press, hold, squeeze, and/or otherwise interact with one or more of the input surfaces 104a, 104b. This may allow the user to activate and/or otherwise provide touch, force, and/or other input to the electronic device 101.

The speaker 102 may define an acoustic chamber in cooperation with an ear of a user. In some implementations, the speaker 102 may also include a microphone acoustic port 105.

As illustrated, the input surfaces 104a, 104b may be defined on opposite sides (i.e., located opposite each other) of the stem 103. This positioning of the input surfaces 104a, 104b with respect to each other may allow force to be applied by squeezing the input surfaces 104a, 104b. As described above with respect to FIG. 1A, the electronic device 101 may include a number of different sensors for detecting touch on and/or force applied to one or more of the input surfaces 104a, 104b.

For example, the electronic device 101 may detect a non-binary amount of force applied to one or more input surfaces 104a, 104b. The amount of the force detected may be non-binary because the electronic device 101 is operative to determine an amount of the force that is applied within a range of force amounts rather than only a binary detection of whether or not force is applied. The electronic device 101 may interpret the applied force as a first input if the amount of the force is less than a force threshold. However, the electronic device 101 may interpret the force as a second input if the amount of the force at least meets the force threshold.

In some examples, the electronic device 101 may determine other information about touch or applied force. For example, the electronic device 101 (or controller or other processing unit thereof) may also determine an amount of time that a force is applied. The electronic device 101 may interpret force that is applied for an extended period of time as a different input than a force that is applied and then immediately released. In such an example, the electronic device 101 may interpret an applied force as multiple different kinds of input depending on the amount of the force that is applied, the amount of time that the force is applied, the direction that force is applied, and/or other aspects of the applied force.

In some implementations, the input surfaces 104a, 104b may be indents in the stem 103. This may provide a physical cue to guide a user to the input surfaces 104a, 104b. However, it is understood that this is an example. In other implementations, the input surfaces 104a, 104b may be otherwise configured without departing from the scope of the present disclosure. By way of illustration, in other implementations, the input surfaces 104a, 104b may be raised portions of the stem 103, ridges on the stem 103, and so on without departing from the scope of the present disclosure.

For example, in some implementations, the input surfaces 104a, 104b may be configured as protrusions from the stem 103. In other implementations, the input surfaces 104a, 104b may be physically contiguous with other sections of the stem 103 but may be indicated by a different color than the other sections of the stem 103. In still other implementations, the input surfaces 104a, 104b may be visually indistinguishable from other sections of the stem 103. Various configurations are possible and contemplated.

In some examples, the electronic device 101 may include both a force sensor and a touch sensor. For example, the force sensor may be positioned adjacent one of the input surfaces 104*a*, 104*b* and the touch sensor may be positioned adjacent the other of the input surfaces 104*a*, 104*b*. As such, the electronic device 101 may be operative to determine both touch and force to the input surfaces 104*a*, 104*b*.

In various examples, the electronic device 101 may use the force sensor to determine a non-binary amount of force applied only upon detection of a touch. This may prevent false readings, as objects other than a user could exert force on the housing. This may also reduce power consumption as compared to operating the force sensor more often or continuously. In examples where the electronic device 101 is powered by one or more batteries and/or is otherwise portable, this reduced power consumption may conserve the life of batteries and/or other components.

In other examples, the electronic device 101 may use the force sensor and a touch sensor to determine the amount of the force. For example, the electronic device 101 may use the force sensor regardless whether or not touch is detected, but may only use signals from the force sensor when a touch is detected.

In still other examples, force sensors may be positioned adjacent to both input surfaces 104*a*, 104*b*. Force sensors may be operated at different power levels. The higher the power level at which a force sensor is operated, the higher a signal to noise ratio of force data from a force sensor may be. Conversely, the lower the power level at which a force sensor is operated, the lower the signal to noise ratio of the force data may be, resulting in less accurate force data due to higher noise. Higher signal to noise ratio is desirable whereas higher power is not. As force data from two force sensors may be evaluated in this example to determine non-binary amounts of applied force, the force sensors may operate in a manner that is less accurate but uses less power. This may be due to the ability to combine the force data for a higher signal to noise ratio despite the lower powered operation of the individual force sensors. The use of the multiple sets of force data may make up for the less accurate but lower powered operation of either force sensor individually.

In yet other examples, multiple force sensors may be used for other purposes than increasing signal to noise ratios by averaging their data. For example, data from multiple force sensors may enable determination of force vector information. In other words, multiple force sensors may enable determination of both magnitude and direction of force. This force vector information may be used to discriminate between intentional application of force to provide input and accidental application of force, such as a user adjusting a position of the electronic device 101. Various configurations are possible and contemplated without departing from the scope of the present disclosure.

As illustrated, the input surfaces 104*a*, 104*b* may be substantially orthogonal to the microphone acoustic port 105. This may prevent the input surfaces 104*a*, 104*b* from touching a user's head during use of the electronic device 101.

Figure 1C:
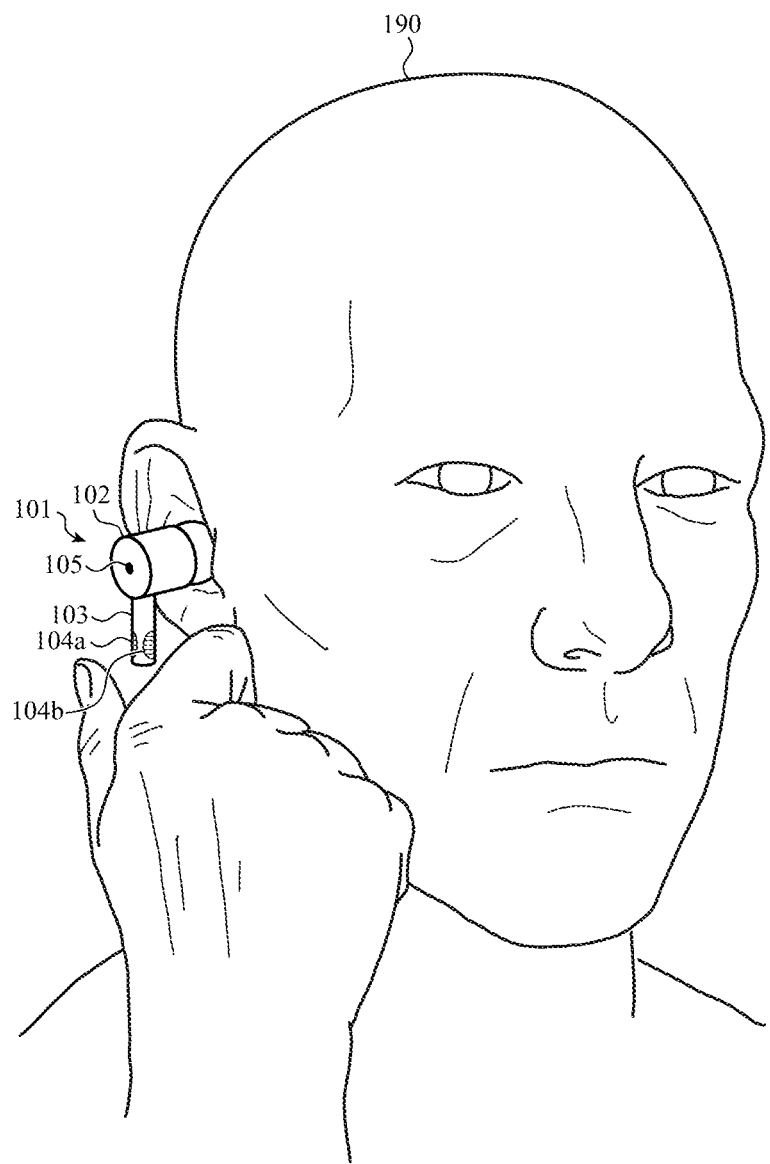
FIG. 1C depicts a user using the example electronic device of FIG. 1B.

FIG. 1C depicts a user 190 using the example electronic device 101 of FIG. 1B. As shown, the user may touch and exert force on the input surfaces 104*a*, 104*b* simultaneously by squeezing the input surfaces 104*a*, 104*b* between the user's finger and thumb. As also shown, the input surfaces 104*a*, 104*b* are positioned to prevent contact with the user's head during use of the electronic device 101.

Figure 1D:
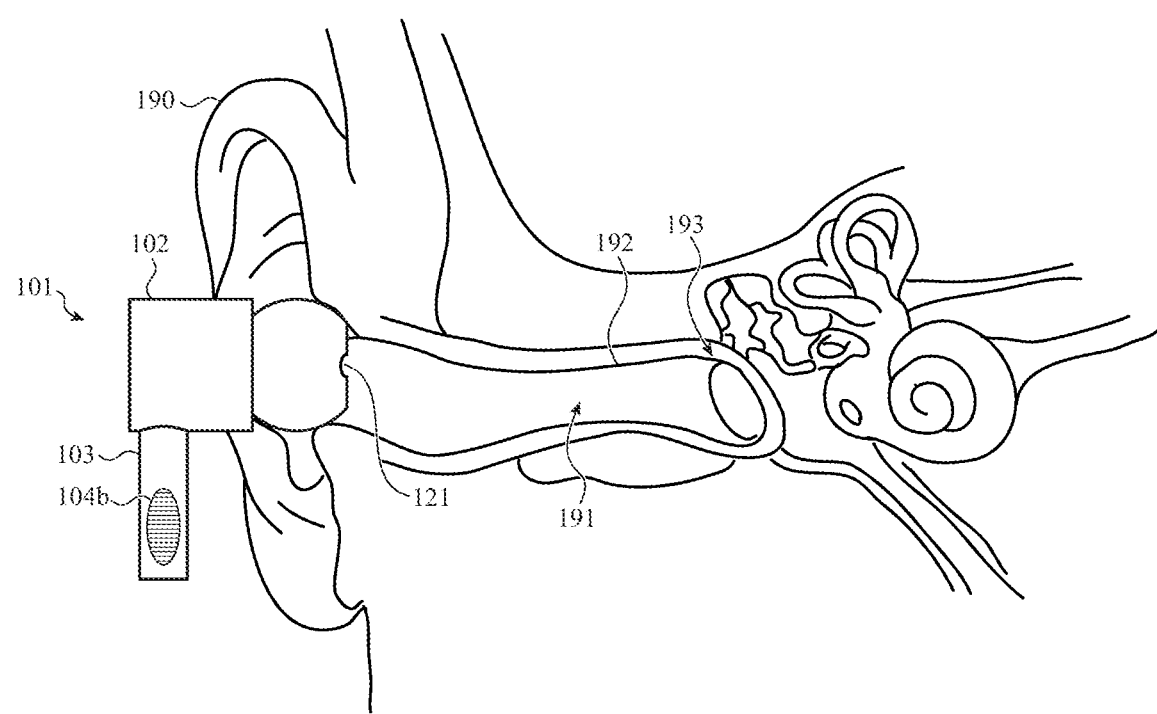
FIG. 1D depicts the electronic device of FIG. 1C forming an acoustic chamber with an ear canal of the user.

FIG. 1D depicts the electronic device 101 forming an acoustic chamber 191 with an ear canal 192 of the user 190. The acoustic chamber 191 may be defined by the speaker 102 of the electronic device 101 at one side of the ear canal 192 of the user 190 and by the eardrum 193 of the user 190 at the other side of the ear canal 192 of the user 190. The electronic device 101 may transmit sound waves into the acoustic chamber 191 through an output acoustic port 121. In this way, the user 190 may be able to hear the sound waves without overly disturbing people in the environment around the user 190.

Figure 2A:
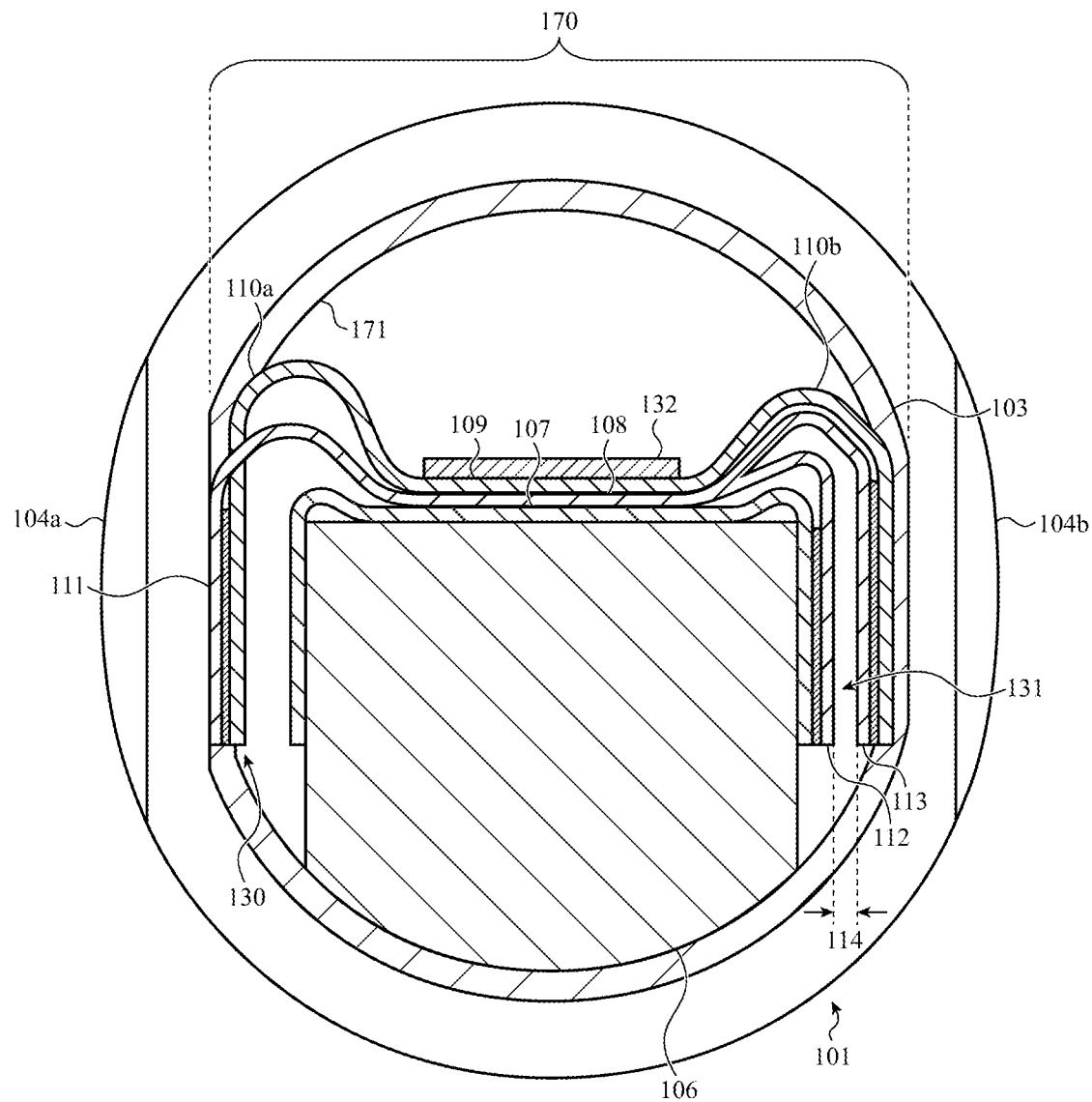
FIG. 2A depicts an example cross-sectional view of the electronic device of FIG. 1A, taken along line A-A of FIG. 1B.

FIG. 2A depicts an example cross-sectional view of the electronic device 101, taken along line A-A of FIG. 1B. An assembly 170 disposed within the stem 103 may include a flexible circuit 108, a spring member 109, an attachment spring member 107, an antenna 106, and a controller 132.

The flexible circuit 108 may form a touch sensor 130 adjacent the input surface 104*a* and a force sensor 131 adjacent the input surface 104*b*. As such, the input surface 104*a* may be a touch input surface and the input surface 104*b* may be a force input surface.

In various implementations, force applied to the force input surface may be determined or estimated upon detection of a touch to the touch input surface. This may reduce power consumption over implementations where force detection is constantly or more frequently performed.

In other examples, the force sensor 131 and touch sensor 130 may be used to determine the amount of the force. For example, the force sensor 131 may be operated regardless whether or not touch is detected, but signals from the force sensor 131 may only be used when the touch sensor 130 detects a touch. This may ensure that a user intentionally applied the force.

The flexible circuit 108 may include multiple circuitry sections that are connected to each other. For example, as shown, the flexible circuit 108 may include a first circuitry section 111, a second circuitry section 113, and a third circuitry section 112. The touch sensor 130 may be formed by the first circuitry section 111. The force sensor 131 may be formed by the second circuitry section 113 and the third circuitry section 112.

Figure 2B:
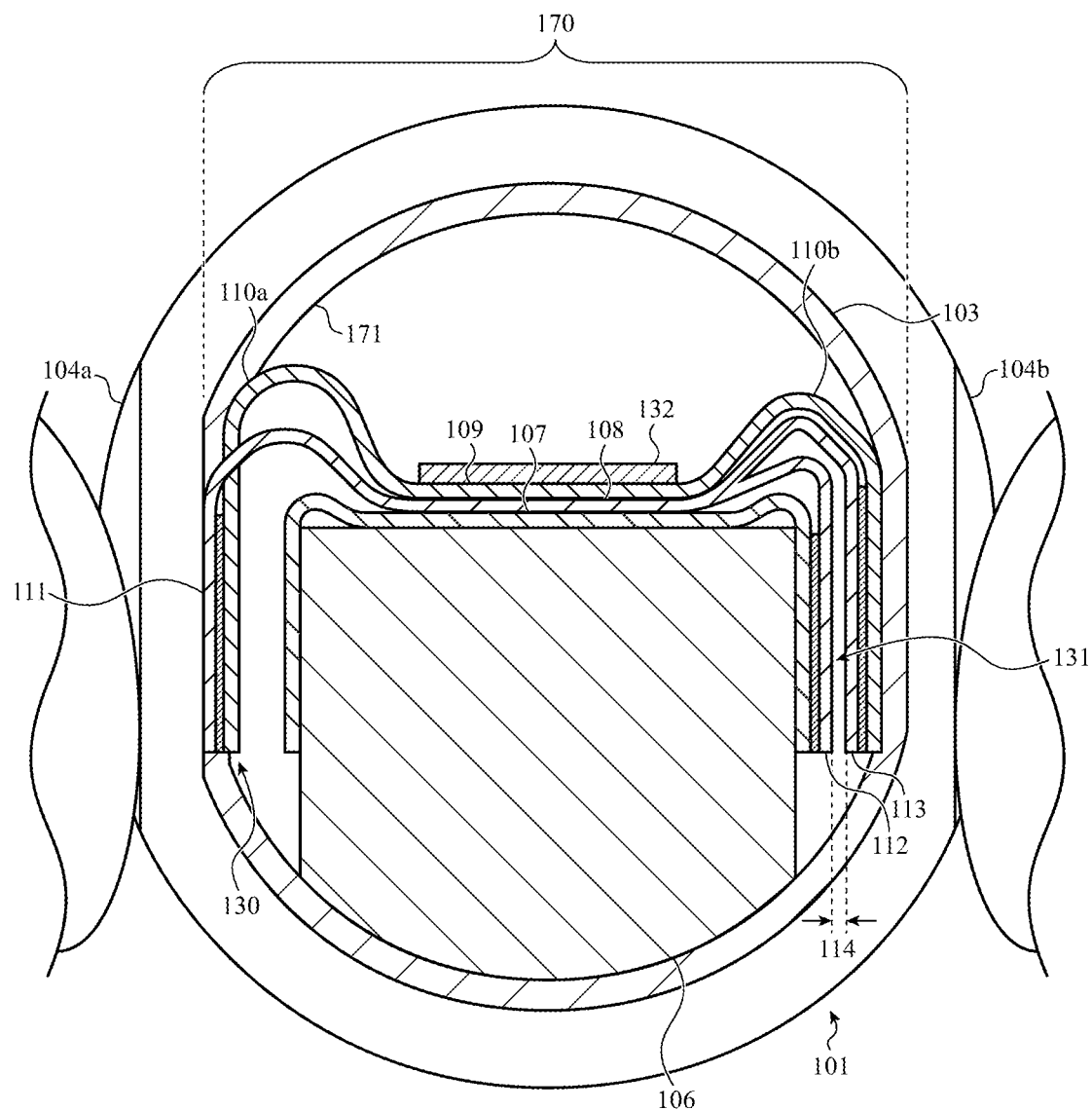
FIG. 2B depicts the electronic device of FIG. 2A when a force is applied to the input surfaces.

The flexible circuit 108 may be able to flex, bend, or otherwise deform to allow the second circuitry section 113 to move toward the third circuitry section 112 when a force is applied to the housing, such as the force input surface. This may reduce a gap 114 (which may be an air gap or otherwise be filled with a dielectric material such as silicone) between the second circuitry section 113 and the third circuitry section 112. The flexible circuit 108 may also be able to flex, bend, or otherwise deform to allow the second circuitry section 113 to move away from the third circuitry section 112 when the force is no longer applied. FIG. 2B depicts the electronic device 101 of FIG. 2A when a force is applied to the input surfaces 104*a*, 104*b*.

With reference to FIGS. 2A and 2B, a spring member 109 may be disposed within the stem 103. The spring member 109 may bias the second circuitry section 113 toward the force input surface of the stem 103. In other words, the spring member 109 may maintain the second circuitry section 113 at an initial position (shown) in the absence of force, allow the second circuitry section 113 to move when force is applied that moves the stem 103, and allows the second circuitry section 113 to return to the initial position when the force is no longer applied. The spring member 109 may also bias the first circuitry section 111 toward the touch input surface of the stem 103.

The spring member 109 may be a torsion spring and/or any other kind of spring. The spring member 109 may be formed of metal, plastic, a combination thereof, and so on. The spring member 109 may include a first arm 110a and a second arm 110b such that the spring member 109 may have an M-shaped cross section. The first arm 110a may bias the first circuitry section 111 toward the touch input surface of the stem 103. The second arm 110b may bias the second circuitry section 113 toward the force input surface of the stem 103. In other implementations, the spring member 109 may be shaped otherwise, such as embodiments where the spring member 109 has a C-shaped cross section, a U-shaped cross section, and so on.

Various portions of the flexible circuit 108 may be coupled or connected to the spring member 109. For example, adhesive may couple the flexible circuit 108 to the spring member 109, the first circuitry section 111 to the first arm 110a, the second circuitry section 113 to the second arm 110b, and so on.

As shown, the first circuitry section 111 is positioned between the first arm 110a and an internal surface 171 of the stem 103. As also shown, the second arm 110b is shown positioned between the second circuitry section 113 and the internal surface 171 of the stem 103. However, these are examples. In various implementations, these positions may be reversed and/or otherwise changed without departing from the scope of the present disclosure.

This configuration of the flexible circuit 108 and the spring member 109 may allow the touch sensor 130 and/or the force sensor 131 to be disposed within the stem 103 without being laminated and/or otherwise affixed to the stem 103. This may simplify manufacture of the electronic device 101.

The flexible circuit 108 may be coupled to an attachment spring member 107 (the spring member 109 being a movement spring member since the spring member 109 facilitates movement rather than attaching the flexible circuit 108) or other attachment member, such as using adhesive. The attachment spring member 107 may clamp or otherwise attach around an antenna 106. The antenna 106 may be an assembly including an antenna carrier with an antenna resonator made of conductive material (such as gold, silver, copper, alloys, or the like) disposed thereon. The antenna 106 may be held in place by the stem 103. By being coupled to the antenna 106, other elements (such as the attachment spring member 107, the flexible circuit 108, and the spring member 109) may be held in place as well.

Although the above illustrates and describes the attachment spring member 107 as attached around the antenna 106, it is understood that this is an example. In other implementations, the attachment spring member 107 and/or other elements (such as the flexible circuit 108, the spring member 109, and so on) may be attached to other components without departing from the scope of the present disclosure. For example, in some implementations, the electronic device 101 may include a battery pack. In such an implementation, the attachment spring member 107 may be attached to the battery pack.

With respect to FIGS. 2A and 2B, a controller 132 or other processor or processing unit (or other control circuitry) may also be disposed in the stem 103. The controller 132 may be electrically and/or otherwise communicably coupled to various portions of the flexible circuit 108. The controller 132 may receive and/or evaluate touch data from the touch sensor 130, receive and/or evaluate force data from the force sensor 131, determine one or more touches using the touch data, determine a non-binary amount of applied force using the force data (and/or other information about the force, such as a duration that the force is applied), and so on. The controller 132 may be connected to a non-transitory storage medium that may store instructions executable by the controller 132.

In various implementations, the controller 132 may only use the force sensor 131 to detect a force applied to the stem 103 or other portion of the housing (such as the input surface 104b) when the touch sensor detects a touch on the stem 103 or other portion of the housing (such as the input surface 104a). In some examples, the touch is on a first area of the housing and the force is applied to a second area of the housing. In various examples, the first area is located opposite the second area. In numerous examples, the first area and the second area are both positioned approximately 90 degrees from a user's head during use of the earphone. In various examples, the touch sensor 130 is inoperable to detect touches on the second area. In numerous examples, the controller 132 is operative to interpret the force as multiple different kinds of input.

Although the above illustrates and describes inputs as touches on and/or force applied to the input surfaces 104a, 104b, it is understood that this is an example. In various implementations, the electronic device 101 may be operable to detect touches on and/or force applied to other portions of the housing without departing from the scope of the present disclosure.

For example, the stem 103 may move when force is applied to areas orthogonal to the input surfaces 104a, 104b. This may cause the gap 114 to increase instead of decrease. Regardless, this may change the capacitance between the second circuitry section 113 and the third circuitry section 112. The non-binary amount of this force may thus be determined using the force data represented by the change in the mutual capacitance.

In some implementations, this change may be opposite the change in the mutual capacitance resulting from force exerted on the input surface 104b. As such, the location that the force is exerted may be determined based on the change in the mutual capacitance. Various configurations are possible and contemplated without departing from the scope of the present disclosure.

The flexible circuit 108 may be a flexible printed circuit board (e.g., a "flex"). In some implementations, the flexible circuit 108 may be formed of conductive material such as copper, silver, gold, or other metallic traces formed on a dielectric, such as polyimide or polyester.

The first circuitry section 111 that forms the touch sensor 130 may include one or more touch electrodes. For example, the first circuitry section 111 may include a touch drive electrode and a touch sense electrode. A touch on the touch input surface may be determined using a change in mutual capacitance of the touch drive electrode and the touch sense electrode. By way of another example, the first circuitry section 111 may include a single touch electrode and a touch to the touch input surface may be determined using a change in the self-capacitance of the single touch electrode.

The second circuitry section 113 that forms the force sensor 131 may include a first force electrode and the third circuitry section 112 may include a second force electrode. For example, in some implementations, the first force electrode may be a force drive electrode and the second force electrode may be a force sense electrode. In other implementations, these may be reversed. Changes in mutual capacitance between the second circuitry section 113 and the third circuitry section 112 (such as between first and second force electrodes respectively included in the second circuitry section 113 and the third circuitry section 112) may be used to determine a non-binary amount of the force.

As such, in some implementations, both the touch sensor 130 and the force sensor 131 may be capacitance sensors. Both may be mutual capacitance sensors. However, it is understood that this is an example. In various implementations, one or more of the touch sensor 130 and the force sensor 131 may be a self-capacitance sensor and/or another kind of sensor without departing from the scope of the present disclosure.

Figure 3A:
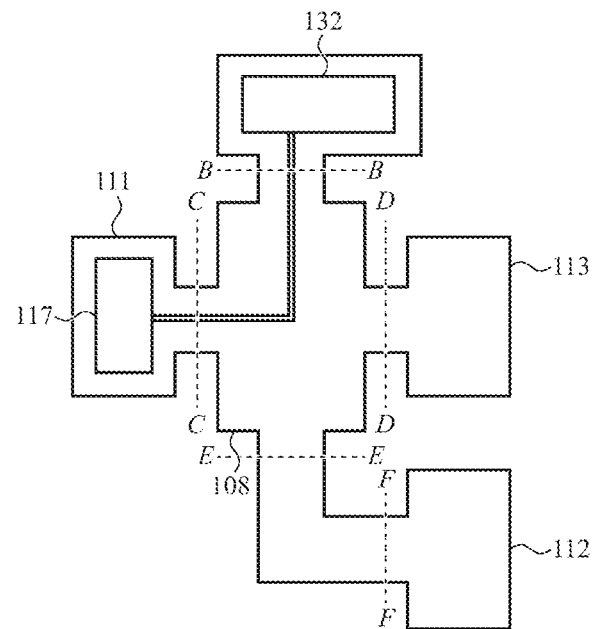
FIG. 3A depicts a first side of an example flexible circuit that may be used to implement the electronic device depicted in FIG. 2A.
Figure 3B:
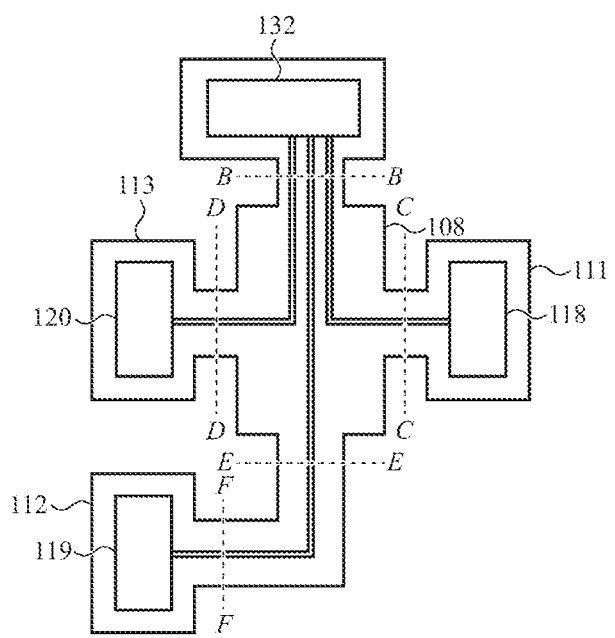
FIG. 3B depicts a second side of the example flexible circuit of FIG. 3A.

For example, FIG. 3A depicts a first side of an example flexible circuit 108 that may be used to implement the electronic device 101 depicted in FIG. 2A. FIG. 3B depicts a second side of the example flexible circuit 108 shown in FIG. 3A. FIGS. 3A and 3B illustrate how a single sheet or other structure of dielectric material (such as polyimide, polyester, and so on) may be configured to form the first circuitry section 111, the second circuitry section 113, and the third circuitry section 112; components such as the controller 132, the touch drive electrode 117, the touch sense electrode 118, the first force electrode 120, and the second force electrode 119 may be coupled thereto; and conductive material such as metal traces may be added thereto to connect such components. This single sheet or other structure may then be bent, folded, and/or otherwise deformed to configure the flexible circuit 108 as shown in FIGS. 2A-2B.

For example, the flexible circuit 108 may be folded along line C-C so that the first circuitry section 111 that includes the touch drive electrode 117 and the touch sense electrode 118 is positioned approximately perpendicular to a central portion of the flexible circuit 108. Similarly, the flexible circuit 108 may be folded along lines D-D and F-F so that the second circuitry section 113 that includes the first force electrode 120 and the third circuitry section 112 that includes the second force electrode 119 are positioned approximately perpendicular to the central portion of the flexible circuit 108. The flexible circuit 108 may then be folded along line E-E so that that the second circuitry section 113 that includes the first force electrode 120 and the third circuitry section 112 that includes the second force electrode 119 are positioned approximately parallel to each other. Finally, the flexible circuit 108 may be folded along line B-B to position the controller 132 over the central portion of the flexible circuit 108. This may result in a configuration similar to that shown in FIGS. 2A-2B and FIG. 4.

Figure 4:
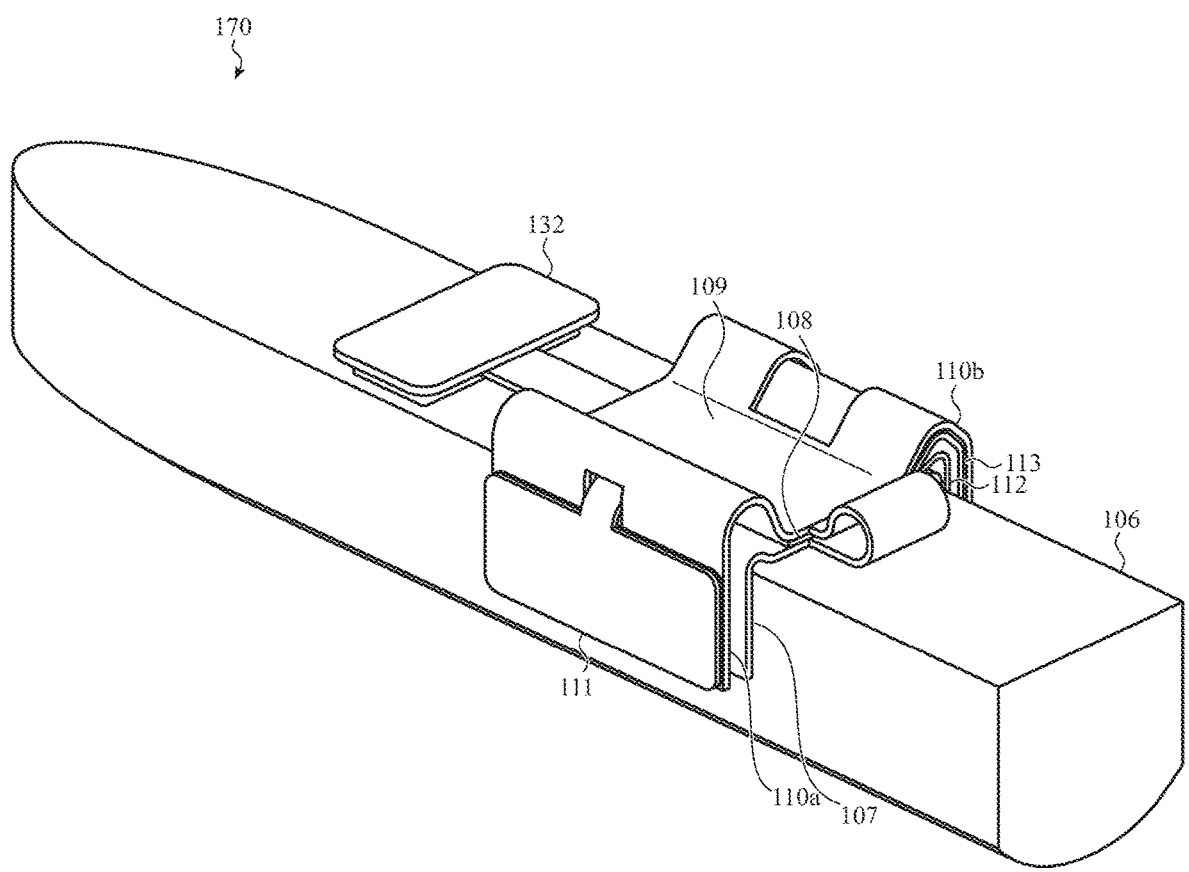
FIG. 4 depicts the assembly of the electronic device of FIG. 2A with the housing removed.

FIG. 4 depicts the assembly 170 of the electronic device 101 of FIG. 2A, including the antenna 106, with the housing removed. FIGS. 2A-2B illustrate the portions of the spring member 109, the first arm 110a, the first circuitry section 111, the second arm 110b, and the second circuitry section 113 that contact the stem 103 as substantially flat. However, it is understood that this is an example and is depicted in this fashion for the purposes of simplicity and clarity. In various implementations, various features (such as one or more protrusions, domes, and/or other features) may be configured on or between one or more of these components without departing from the scope of the present disclosure. Various configurations are possible and contemplated.

Figure 5:
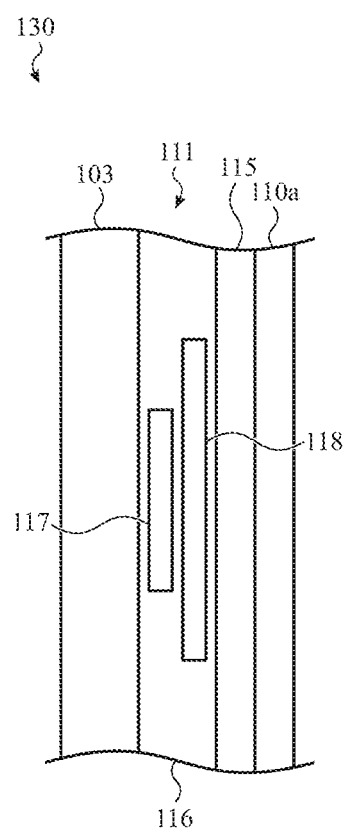
FIG. 5 depicts an example stack up that may be used to implement the touch sensor depicted in FIG. 2A.

FIG. 5 depicts an example stack up that may be used to implement the touch sensor 130 depicted in FIG. 2A. The orientation of the stack up may correspond to the position of the stem 103, the first circuitry section 111, and the first arm 110a illustrated in FIG. 2A. The stack up may include the stem 103, the first circuitry section 111, adhesive 115, and the first arm 110a. The first circuitry section 111 may include one or more touch drive electrodes 117 and touch sense electrodes 118 positioned on or within a dielectric 116 (such as polyimide, polyester, and so on).

A touch of a user on the stem 103 may alter a capacitance between the touch drive electrode 117 and the touch sense electrode 118. As illustrated in FIG. 3, a controller 132 may be electrically connected to the touch drive electrode 117 and the touch sense electrode 118 and may monitor the capacitance between the touch drive electrode 117 and the touch sense electrode 118 to determine when a touch occurs using changes in the capacitance.

The touch drive electrode 117 and the touch sense electrode 118 are illustrated as having a particular configuration and orientation with respect to each other. The configuration and orientation of the touch drive electrode 117 and the touch sense electrode 118 with respect to each other may affect the capacitance between the touch drive electrode 117 and the touch sense electrode 118 and how that capacitance changes when a user touches the stem 103. The touch drive electrode 117 and the touch sense electrode 118 may be arranged in a variety of different configurations and orientations to obtain specific properties with respect to the capacitance between the touch drive electrode 117 and the touch sense electrode 118 and how that capacitance changes when a user touches the stem 103.

Figure 6:
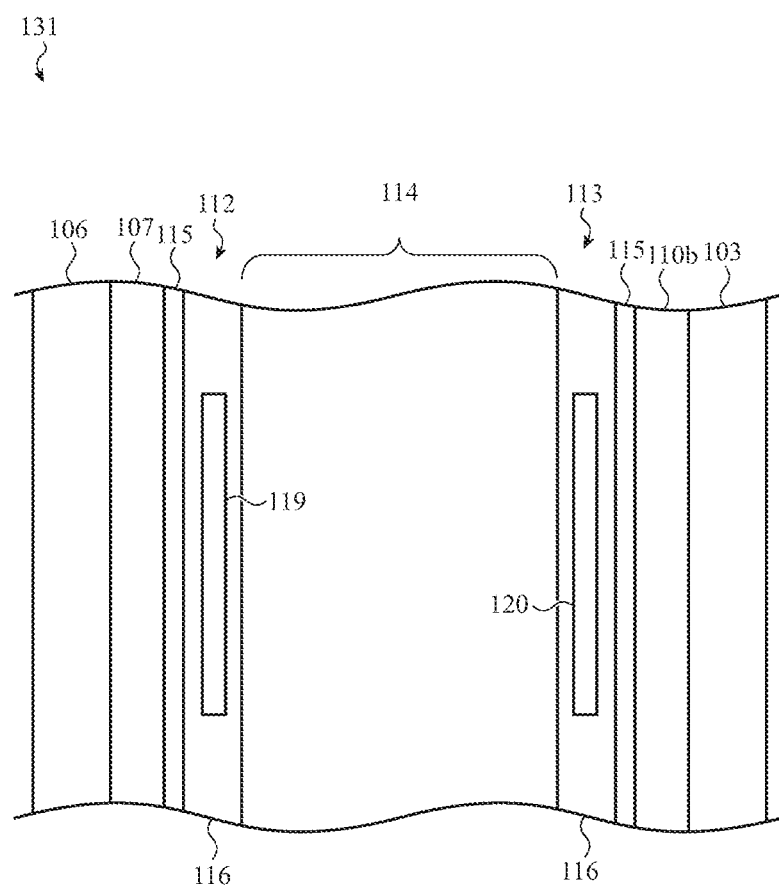
FIG. 6 depicts an example stack up that may be used to implement the force sensor depicted in FIG. 2A.

FIG. 6 depicts an example stack up that may be used to implement the force sensor 131 depicted in FIG. 2A. The orientation of the stack up may correspond to the position of the stem 103, the second arm 110b, the second circuitry section 113, the third circuitry section 112, the attachment spring member 107, and the antenna 106 in FIG. 2A. The stack up may include the antenna 106, the attachment spring member 107, adhesive 115, the third circuitry section 112, the gap 114, the second circuitry section 113, adhesive 115, the second arm 110b, and the stem 103. The second circuitry section 113 may include one or more first force electrodes 120 positioned on or within a dielectric 116 (such as polyimide, polyester, and so on). The third circuitry section 112 may include one or more second force electrodes 119 positioned on or within a dielectric 116 (such as polyimide, polyester, and so on). In some implementations, the first force electrode 120 may be a force drive electrode and the second force electrode 119 may be a force sense electrode. In other implementations, the first force electrode 120 may be a force sense electrode and the second force electrode 119 may be a force drive electrode.

Force exerted by a user on the stem 103 may alter the gap 114 between the first force electrode 120 and the second force electrode 119. Altering the gap 114 between the first force electrode 120 and the second force electrode 119 may alter a capacitance between the first force electrode 120 and the second force electrode 119. As illustrated in FIG. 3, a controller 132 may be electrically connected to the first force electrode 120 and the second force electrode 119 and may monitor the capacitance between the first force electrode 120 and the second force electrode 119 to determine or estimate a non-binary amount of the force that is applied using the changes in the capacitance.

The first force electrode 120 and the second force electrode 119 are illustrated as having a particular configuration and orientation with respect to each other. The configuration and orientation of the first force electrode 120 and the second force electrode 119 with respect to each other may affect the capacitance between first force electrode 120 and the second force electrode 119 and how that capacitance changes when a user applies force to the stem 103. The first force electrode 120 and the second force electrode 119 may be arranged in a variety of different configurations and orientations to obtain specific properties with respect to the capacitance between the first force electrode 120 and the second force electrode 119 and how that capacitance changes when a user applies force to the stem 103.

FIGS. 2A-6 illustrate and describe touch sensors 130 and force sensors 131 having particular configurations and particular manners of operation. However, it is understood that these are examples and that other implementations are possible and contemplated. For example, the touch sensor 130 may be replaced with one or more proximity sensors without departing from the scope of the present disclosure.

By way of another example, in some implementations, one or more strain gauges may be laminated and/or otherwise coupled or attached to internal areas of the housing adjacent one or more of the input surfaces 104*a*, 104*b*. An applied force may cause strain in or on the housing. The strain gauges may detect the strain. Such strain data may be evaluated to determine a non-binary amount of the force exerted.

By way of yet another example, in some implementations, one or more touch or force sensors (and/or one or more touch sensing electrodes of such a touch or force sensor) may be laminated and/or otherwise coupled or attached to internal areas of the housing (and/or embedded within the housing) adjacent one or more of the input surfaces 104*a*, 104*b*. The housing may deform from an initial position when a force is applied and return to the initial position when the force is removed. As such, the housing may function as the spring member 109 in some embodiments. The touch or force sensors may detect the deformation and output signals that may be used to determine a touch and/or an amount of the applied force.

In some examples, one or more switches, such as one or more dome switches, may be positioned adjacent to the input surfaces 104*a*, 104*b*. Applied force may deform the housing, which may collapse the domes and close the switch. Output from the switches may be used to determine a non-binary amount of the applied force.

In various examples, one or more optical sensors may be disposed in the housing. The optical sensors may detect movement of the housing caused by the application of force. In such an example, output from the optical sensors may be evaluated to determine a non-binary amount of a force that is applied.

In numerous examples, one or more temperature sensors may be used to detect temperature changes of the input surfaces 104*a*, 104*b*. When the user 190 exerts different amounts of force on the input surfaces 104*a*, 104*b*, the body of the user 190 may change the temperature of the input surfaces 104*a*, 104*b*. For example, body heat of the user 190 may thermally conduct to the input surfaces 104*a*, 104*b* when the user 190 exerts force on the input surfaces 104*a*, 104*b*, raising the temperature of the input surfaces 104*a*, 104*b*. This thermally conducted heat may increase the temperature of the input surfaces 104*a*, 104*b* higher the more force the user 190 exerts. As such, a non-binary amount of the force may be determined based on the temperature changes detected by the temperature sensors.

In some examples, one or more pressure sensors may be disposed within the housing. The pressure sensor may measure the pressure of an internal cavity defined within the housing. Force applied to one or more of the input surfaces 104*a*, 104*b* may change the pressure of the internal cavity. The electronic device 101 may determine a non-binary amount of the force based on pressure changes detected by the pressure sensor.

Figure 7:
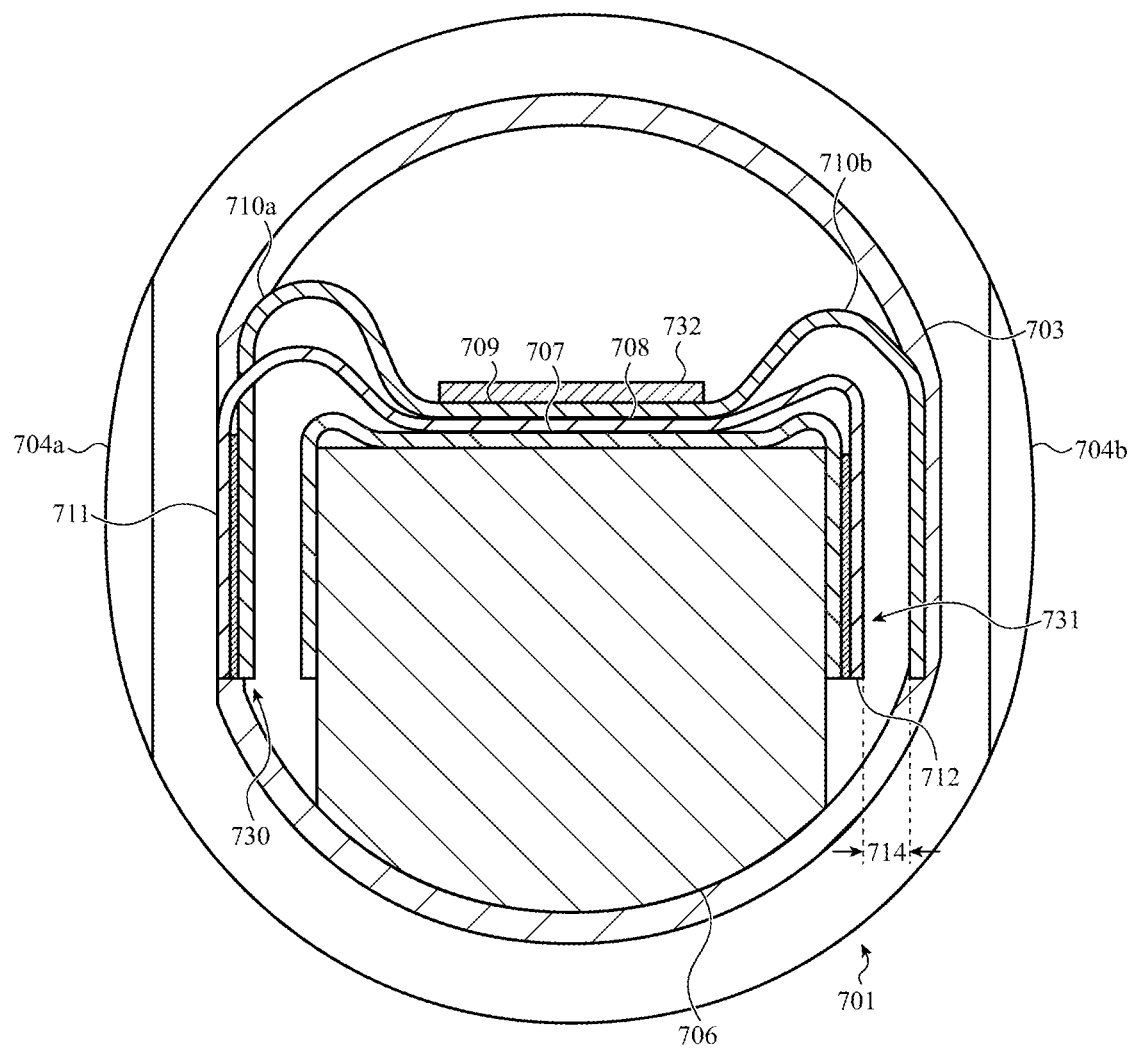
FIG. 7 depicts a first alternative example of the electronic device of FIG. 2A.

In various examples, force may be determined using self-capacitance of a force electrode. By way of illustration, FIG. 7 depicts a first alternative example of the electronic device 101 of FIG. 2A. The electronic device 701 may include a stem 703 of a housing that defines a touch input surface 704*a* and a force input surface 704*b*. The electronic device 701 may also include a flexible circuit 708 with a first circuitry section 711 that forms a touch sensor 730 and a second circuitry section 712 that forms a force sensor 731. The electronic device 701 may additionally include a spring member 709 with a first arm 710*a* that biases the first circuitry section 711 toward the touch input surface 704*a* and a second arm 710*b*.

The second circuitry section 712 may include a force electrode. The force sensor 731 may monitor the self-capacitance of that force electrode. The second arm 710*b* may function as a ground that affects the self-capacitance depending on the size of the gap 714 between the second circuitry section 712 and the second arm 710*b*. A non-binary amount of force applied to the force input surface 704*b* may be determined using changes in the self-capacitance of the force electrode.

Additionally, the electronic device 701 may include an antenna assembly 706, an attachment spring 707 that is coupled to the antenna assembly 706 and the flexible circuit 708. Moreover, the electronic device 701 may include a controller 732 that is electrically and/or otherwise communicably coupled to the flexible circuit 708.

In still other implementations, one or more of the components of the electronic device 701 may be changed. For example, in some implementations, the touch sensor 730 may be replaced with a proximity sensor. In such implementations, the force sensor 731 may be operated upon detection of proximity using the proximity sensor.

In other examples, the touch sensor 730 may be replaced with another force sensor. The force sensor may be similar to the force sensor 731, the force sensor 131 of FIGS. 2A-2B (such as using third and fourth force electrodes that move with respect to each other when force is applied or removed where a non-binary amount of force may be determined based on changes in mutual capacitance between the third and fourth force electrodes), and/or otherwise configured. In such cases where multiple force sensors are used, touch or proximity may not be used to trigger operation of a force sensor. In such examples, the two force sensors may be operated more frequently. In some implementations, the two force sensors may be operated at a lower power that yields less accurate measurements. The less accuracy of the measurement may be compensated for by using the additional force data supplied from having multiple force sensors.

In some implementations, the touch input surface 704*a* and the force input surface 704*b* may be reversed. One or more of the touch sensor 730 or the force sensor 731 may be more sensitive to interference from proximity to a user's neck or other body part. As such, the respective sensor may be located so as to be as far from that body part as is possible to minimize interference. Various configurations are possible and contemplated without departing from the scope of the present disclosure.

Figure 8:
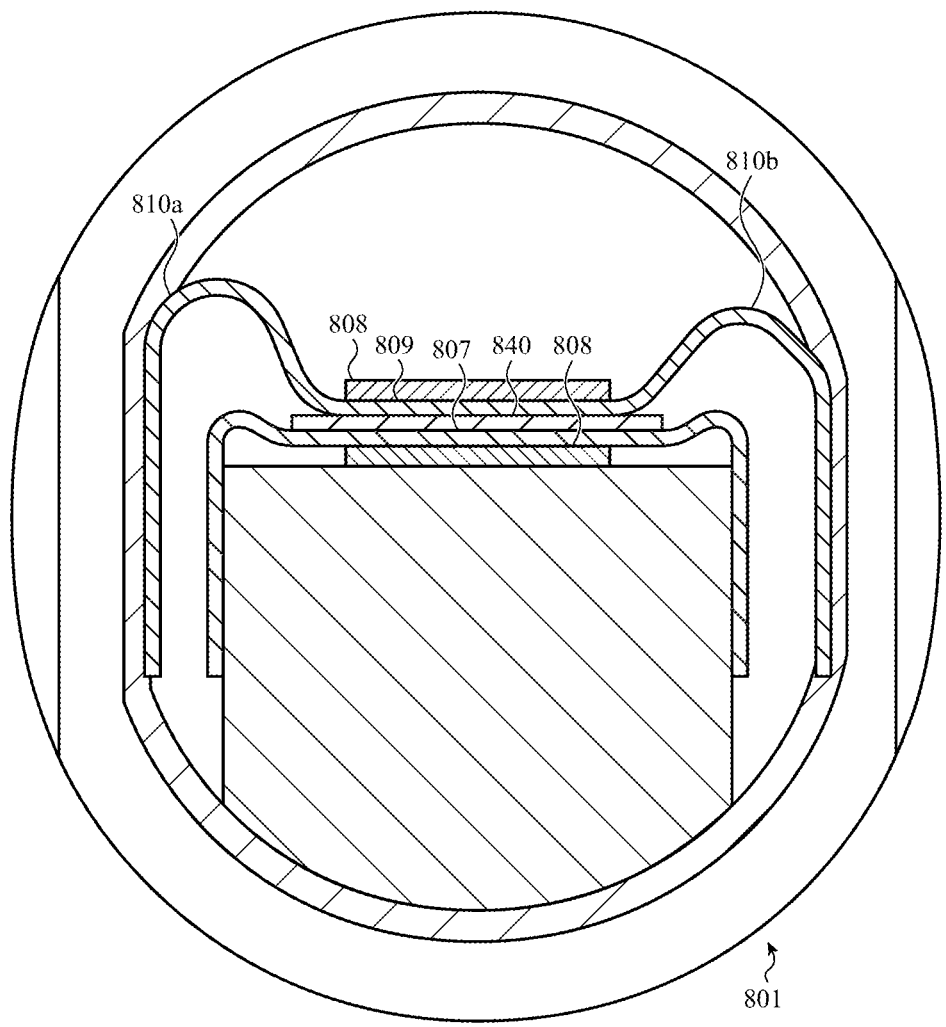
FIG. 8 depicts a second alternative example of the electronic device of FIG. 2A.

FIG. 8 depicts a second alternative example of the electronic device 101 of FIG. 2A. In this example, an electronic device 801 may electrically connect a flexible circuit 808 to a spring member 809 and an attachment spring member 807. An insulator 840 may separate and/or electrically isolate the spring member 809 and the attachment spring member 807 from each other. Movement of a first arm 810*a* and a second arm 810*b* with respect to the attachment spring member 807 changes a capacitance between the spring member 809 and the attachment spring member 807. In this example, the electronic device 801 may determine amounts of force applied using changes in capacitance between the spring member 809 and the attachment spring member 807. As such, the spring member 809 and the attachment spring member 807 may function as electrodes of a force sensor.

In some implementations of this example, the attachment spring member 807 may be used as a drive force sensor and the spring member 809 may be used as a sense force electrode. However, in other examples, the roles of these electrodes may be reversed without departing from the scope of the present disclosure.

Figure 9:
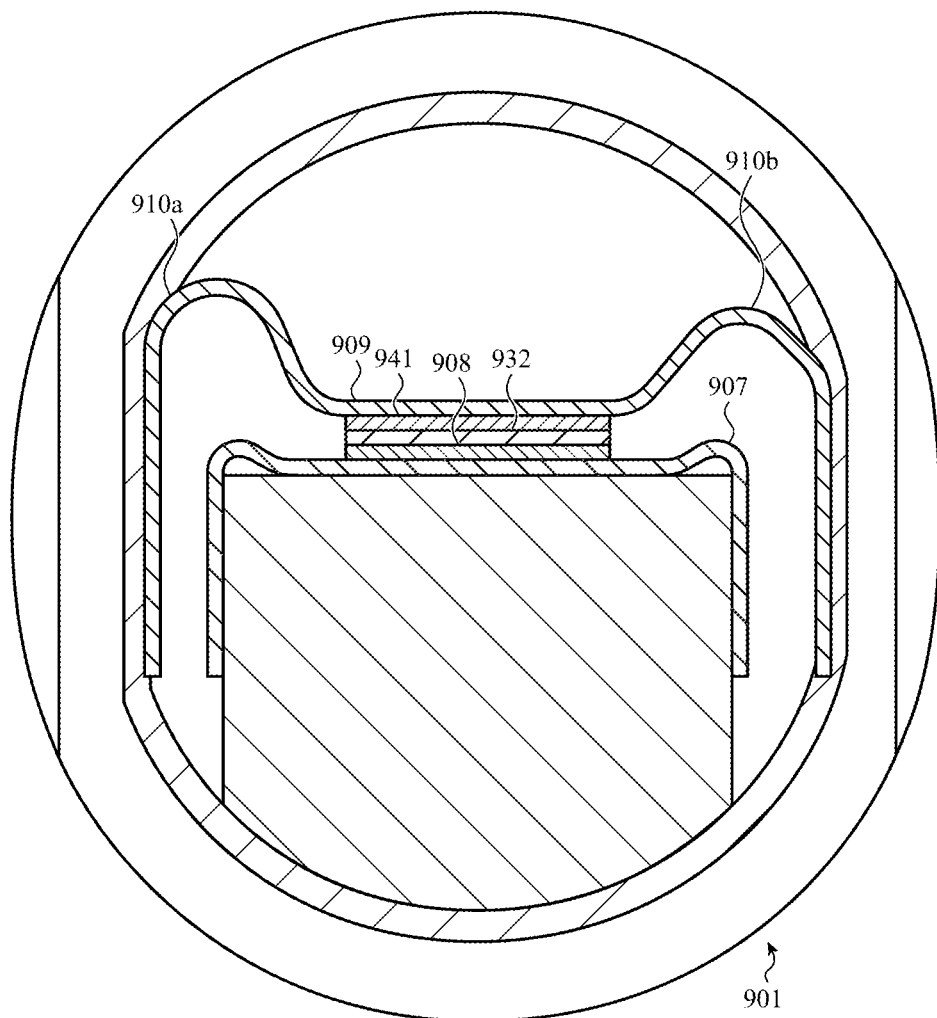
FIG. 9 depicts a third alternative example of the electronic device of FIG. 2A.

FIG. 9 depicts a third alternative example of the electronic device 101 of FIG. 2A. In this example electronic device 901, a controller 932 may be electrically connected to an attachment spring member 907 via a flexible circuit 908. The controller 932 may be operative to monitor a self-capacitance of the attachment spring member 907. A spring member 909 may also be coupled to the controller 932, such as via a laser weld 941 so as to be operable as a ground for the attachment spring member 907. Movement of a first arm 910a and a second arm 910b with respect to the attachment spring member 907 changes the self-capacitance of the attachment spring member 907. In this example, the electronic device 901 may determine amounts of force applied using changes in the self-capacitance of the attachment spring member 907.

Although this example uses the spring member 909 as a ground for the self-capacitance of the attachment spring member 907, it is understood that this is an example. In other implementations, the spring member 909 may be electrically connected to the controller 932 such that the controller 932 is operable to monitor a mutual capacitance between the spring member 909 and the attachment spring member 907.

Figure 10:
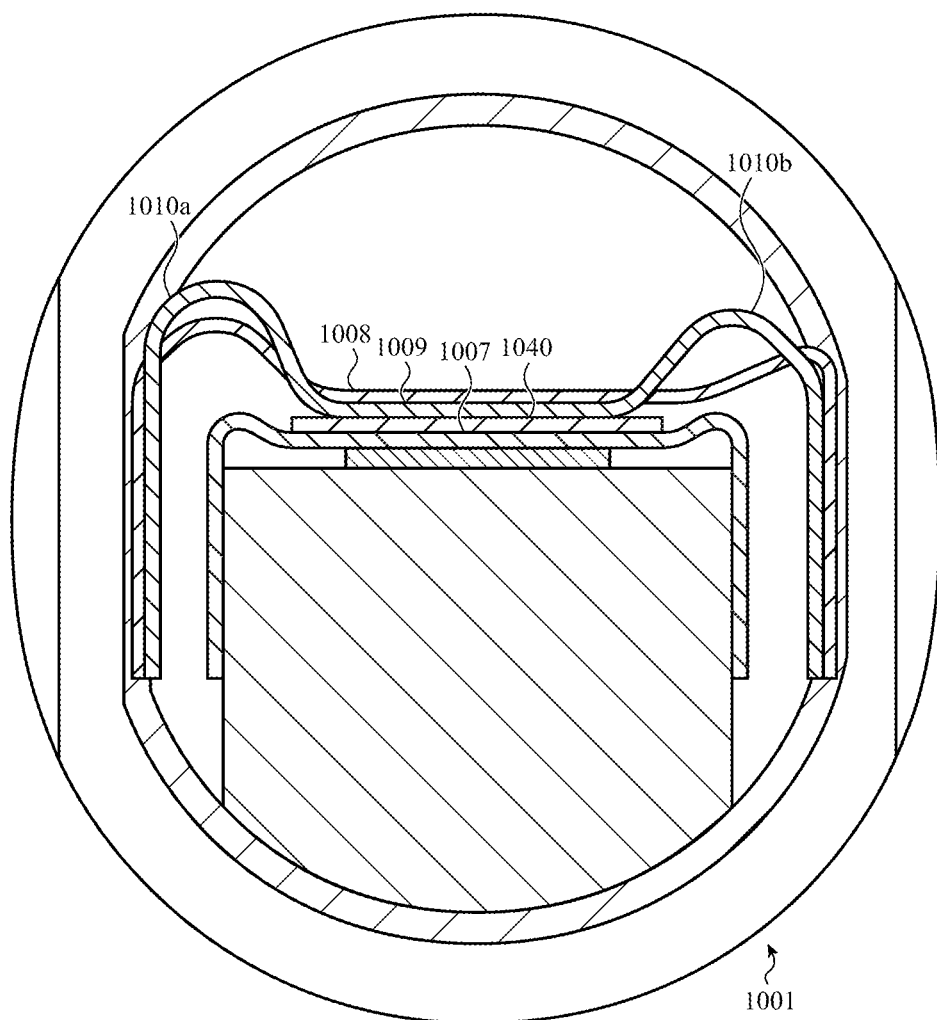
FIG. 10 depicts a fourth alternative example of the electronic device of FIG. 2A.

FIG. 10 depicts a fourth alternative example of the electronic device 101 of FIG. 2A. In this example electronic device 1001, a spring member 1009 may allow a flexible circuit 1008 to move with respect to an attachment spring member 1007 when force is applied. The flexible circuit 1008 may be electrically coupled to the attachment spring member 1007, which may be electrically isolated from the spring member 1009 by an insulator 1040. Movement of a first arm 1010a and a second arm 1010b of the spring member 1009 may change a capacitance between the attachment spring member 1007 and circuitry included in the flexible circuit 1008. The capacitance may be used to determine an amount of applied force. As such, the attachment spring member 1007 and/or one or more portions of the flexible circuit 1008 may form a force sensor and/or a touch sensor.

In other implementations, the insulator 1040 may be omitted. In such other implementations, the spring member 1009 may be coupled to the attachment spring member 1007 via a controller and flexible circuit similar to how the controller 932 and flexible circuit 908 of FIG. 9 connect the spring member 909 and the attachment spring member 907. Various configurations are possible and contemplated without departing from the scope of the present disclosure.

In various implementations, an earphone includes a housing, a flexible circuit disposed in the housing, and a controller disposed in the housing. The housing includes a speaker and a stem extending from the speaker and defining a touch input surface and a force input surface opposite the touch input surface. The flexible circuit includes a first circuitry section, a second circuitry section, and a third circuitry section. The flexible circuit flexes to allow the second circuitry section to move toward the third circuitry section when a force is applied to the force input surface and away from the third circuitry section when the force is no longer applied. The controller is operative to determine a touch to the touch input surface using a first change in a first mutual capacitance detected using the first circuitry section and a non-binary amount of the force using a second change in a second mutual capacitance detected using the second circuitry section and the third circuitry section.

In some examples, the controller uses the second circuitry section and the third circuitry section to determine the non-binary amount of the force upon determining the touch. In numerous examples, the earphone further includes an antenna disposed within the housing. The flexible circuit may be mounted to the antenna. In some examples, the speaker defines an acoustic port and the touch input surface and the force input surface are substantially orthogonal to the acoustic port.

In various examples, the controller determines an amount of time that the force is applied. In some examples, the controller interprets the force as a first input if the non-binary amount of the force is below a force threshold and a second input if the non-binary amount of the force at least meets the force threshold.

In some implementations, an electronic device includes a housing defining a force input surface, a first force electrode disposed within the housing, a second force electrode disposed within the housing, a spring member biasing the first force electrode toward the housing and allowing the first force electrode to move toward the second force electrode when an input force is applied to the force input surface, and a controller. The controller is operative to determine a non-binary amount of the force using a change in a capacitance between the first force electrode and the second force electrode. The capacitance may be a mutual capacitance.

In some examples, the electronic device further includes a touch sensor disposed within the housing. In some embodiments of such examples, the housing defines a touch input surface and the spring member includes a first arm that biases the touch sensor toward the touch input surface and a second arm that biases the first force electrode toward the force input surface.

In various examples, the spring member is at least one of metal or plastic. In numerous examples, the spring member has an M-shaped cross section.

In some examples, the housing defines an additional force input surface. In some embodiments of such examples, the earphone further includes a third force electrode disposed within the housing adjacent to the additional force input surface and a fourth force electrode disposed within the housing. In such embodiments, the non-binary amount of the input force is determinable using the capacitance between the first force electrode and the second force electrode and an additional capacitance between the third force electrode and the fourth force electrode.

In numerous examples, the controller is operative to determine an additional force applied to an area of the housing other than the force input surface using an additional change in the capacitance between the first force electrode and the second force electrode. The area may be orthogonal to the force input surface and the additional change in the capacitance may be opposite the change in the mutual capacitance.

Figure 11:
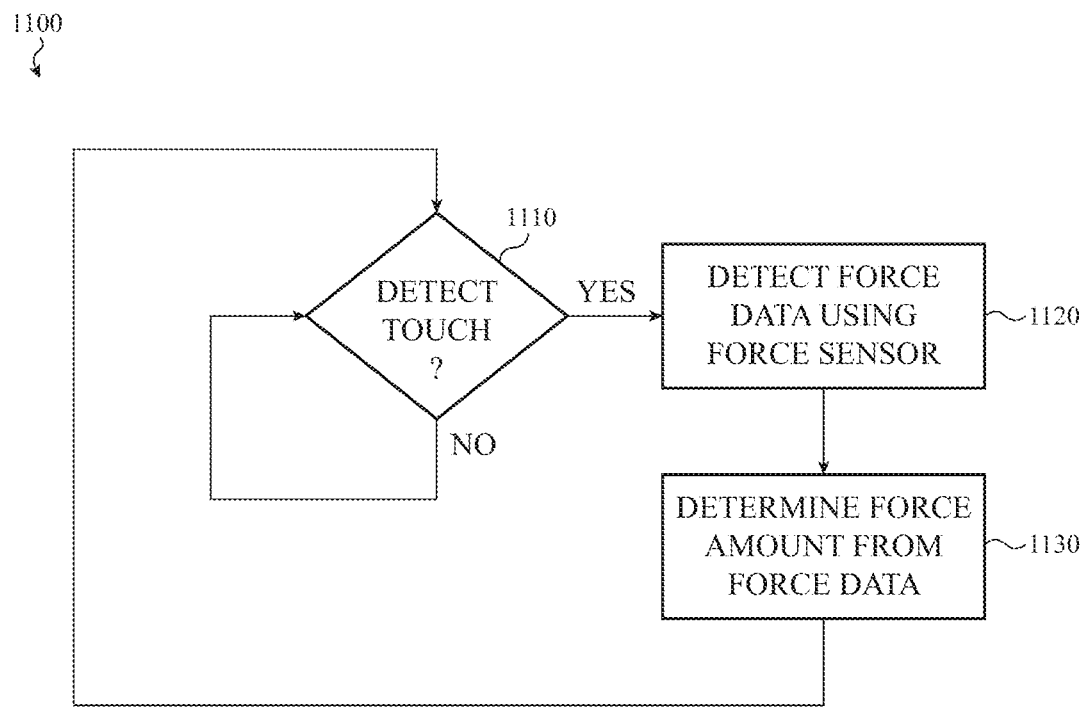
FIG. 11 depicts a flow chart illustrating an example method for operating a device that includes a force sensor. This method may be performed using the electronic device of FIGS. 1A-2B.

FIG. 11 depicts a flow chart illustrating an example method 1100 for operating a device that includes a force sensor. This method may be performed using the electronic device 101 of FIGS. 1A–2B.

At 1110, a controller determines whether or not a touch is detected. The controller may determine whether or not a touch is detected using one or more touch sensors. If so, the flow proceeds to 1120. Otherwise, the flow returns to 1110 where the controller again determines whether or not a touch is detected.

At 1120, after the touch is detected, the controller detects force data using a force sensor. The flow then proceeds to 1130 where the controller determines or estimates a non-binary amount of the force from the force data. The flow then returns to 1110 where the controller again determines whether or not a touch is detected.

Although the example method 1100 is illustrated and described as including particular operations performed in a particular order, it is understood that this is an example. In various implementations, various orders of the same, similar, and/or different operations may be performed without departing from the scope of the present disclosure.

For example, in some implementations, an action may be performed using the determined non-binary amount of the force. In some examples, the controller may interpret the determined non-binary amount of the force as an input. The controller may perform one or more actions according to the input corresponding to the determined non-binary amount of the force.

In various implementations, an earphone includes a housing, a spring member disposed within the housing that moves when a force is applied to the housing, a touch sensor coupled to the spring member, a touch sensor coupled to the spring member that is configured to detect a touch on the housing, a force sensor coupled to the spring member, and a controller that uses the force sensor and the touch sensor to determine an amount of the force.

In some examples, the touch is on a first area of the housing and the force is applied to a second area of the housing. In various such examples, the first area is located opposite the second area. In some such examples, the first area and the second area are both positioned approximately 90 degrees from a user's head during use of the earphone.

In various examples, the touch sensor is inoperable to detect touches on the second area. In some examples, the controller is operative to interpret the force as multiple different kinds of input.

Figure 12:
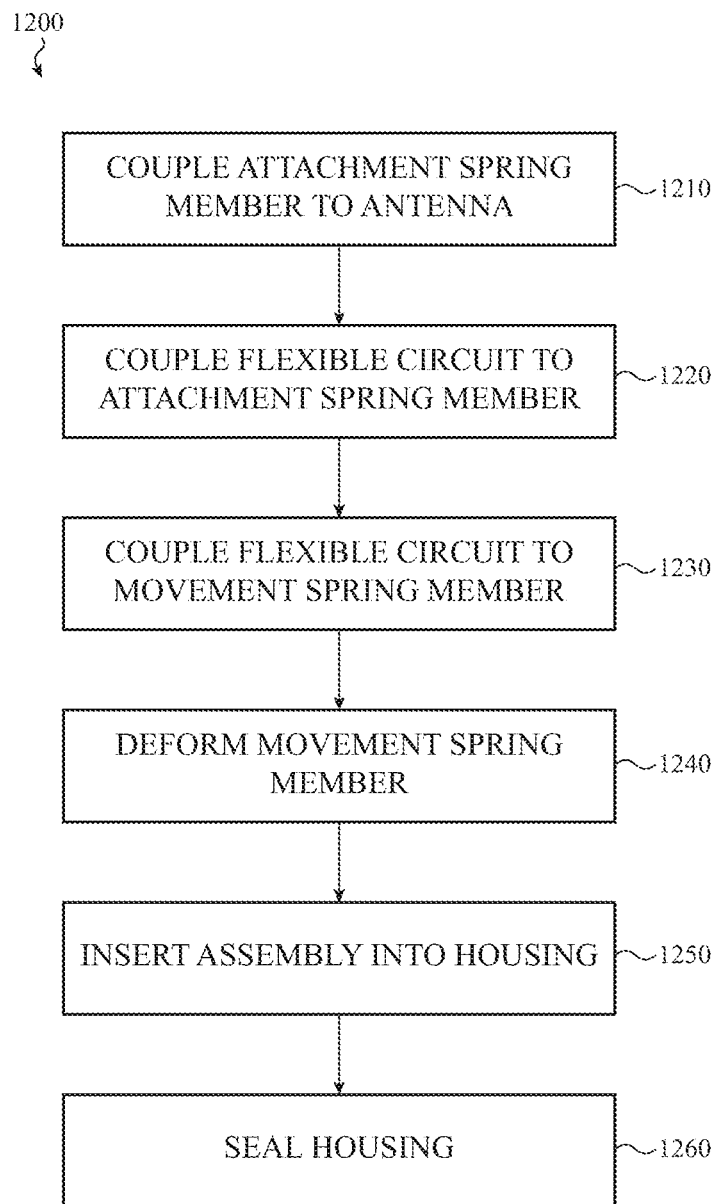
FIG. 12 depicts a flow chart illustrating an example method for assembling an electronic device. The method may assemble the electronic device of FIG. 2A.

FIG. 12 depicts a flow chart illustrating an example method 1200 for assembling an electronic device. The method 1200 may assemble the electronic device of FIG. 2A.

At 1210, an attachment spring member may be coupled to an antenna. At 1220, a flexible circuit may be coupled to the attachment spring member. At 1230, the flexible circuit may be coupled to a movement spring member. At 1240, the movement spring member may be deformed. For example, the movement spring member may be deformed so that the assembly produced by 1210-1230 can fit into an opening in a housing. At 1250, the assembly produced by 1210-1240 is inserted into a housing. At 1260, the housing is sealed.

For example, sealing the housing may include coupling a cap to an opening in a housing into which the assembly produced by 1210-1240 is inserted. The opening may be in an end of a stem of a housing. The electronic device may be an earphone with a housing that includes the stem and a speaker.

Although the example method 1200 is illustrated and described as including particular operations performed in a particular order, it is understood that this is an example. In various implementations, various orders of the same, similar, and/or different operations may be performed without departing from the scope of the present disclosure.

For example, the method 1200 is illustrated and described as deforming the movement spring member and then inserting the assembly produced by 1210-1240 into a housing. However, in some implementations, insertion of the assembly into the housing may deform the movement spring member sufficiently to allow insertion. In such implementations, a separate operation to deform the movement spring member may be omitted.

As described above and illustrated in the accompanying figures, the present disclosure relates to force-activated electronic devices, such as earphones. A non-binary amount of a force applied to a force input surface defined by a housing is determinable using a change in capacitance between first and second force electrodes. A spring member disposed within the housing biases the first force electrode towards the housing and allows it to move towards the second force electrode when the force is applied. In some implementations, an earphone may detect touch on a touch input surface defined by the housing. In various examples of such an implementation, the earphone may determine the non-binary amount of the force upon detection of the touch. In other implementations, the earphone may use signals from both a touch sensor and a force sensor to determine applied force. In a particular embodiment, the first and second force electrodes may be implemented using separate sections of a single flexible circuit. This flexible circuit may flex to allow the first force electrode to move toward the second force electrode when the force is applied. This flexible circuit may also flex to allow the first force electrode to move away from the second force electrode when the force is no longer applied.

In the present disclosure, the methods disclosed may be implemented using one or more sets of instructions or software readable by a device. Further, it is understood that the specific order or hierarchy of steps in the methods disclosed are examples of sample approaches. In other embodiments, the specific order or hierarchy of steps in the method can be rearranged while remaining within the disclosed subject matter. The accompanying method claims present elements of the various steps in a sample order, and are not necessarily meant to be limited to the specific order or hierarchy presented.

The described disclosure may be provided as a computer program product, or software, that may include a non-transitory machine-readable medium having stored thereon instructions, which may be used to program a computer system (or other electronic devices) to perform a process according to the present disclosure. A non-transitory machine-readable medium includes any mechanism for storing information in a form (e.g., software, processing application) readable by a machine (e.g., a computer). The non-transitory machine-readable medium may take the form of, but is not limited to, a magnetic storage medium (e.g., floppy diskette, video cassette, and so on); optical storage medium (e.g., CD-ROM); magneto-optical storage medium; read only memory (ROM); random access memory (RAM); erasable programmable memory (e.g., EPROM and EEPROM); flash memory; and so on.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

What is claimed is:

1. An earphone, comprising:
a speaker housing;
a speaker positioned in the speaker housing;
a stem extending from the speaker housing, the stem having an internal wall;
a flap disposed inside the stem and extending toward the internal wall;
a sensor disposed within the stem that produces a signal in response to bending of the flap; and
a controller that determines an input using the signal.

2. The earphone of claim 1, wherein the flap is operable to bend in response to a force exerted on the stem.

3. The earphone of claim 2, wherein the input comprises an amount of force.

4. The earphone of claim 2, wherein the sensor is a force sensor.

5. The earphone of claim 2, wherein the sensor is a capacitive sensor.

6. The earphone of claim 1, further comprising a structure to which the flap is coupled.

7. The earphone of claim 1, wherein:
the flap is a first flap;
the first flap extends toward a first portion of the internal wall; and
the earphone further comprises a second flap that is disposed inside the stem and extends toward a second portion of the internal wall.

8. An earphone, comprising:
a speaker housing;
a speaker positioned in the speaker housing;
a stem extending from the speaker housing;
a flexible arm disposed inside the stem, extending toward the stem, and defining an acute angle;
a sensor disposed within the stem that is operable to produce a signal in response to bending of the flexible arm; and
a controller that is operative to determine an input using the sensor.

9. The earphone of claim 8, wherein a portion of the flexible arm is flush with the stem.

10. The earphone of claim 8, wherein:
the flexible arm extends toward a first side of the stem;
the flexible arm is a first flexible arm; and
the earphone further comprises a second flexible arm that is disposed inside the stem that extends toward a second side of the internal structure that is opposite the first side.

11. The earphone of claim 8, wherein at least a portion of the sensor is positioned on the flexible arm.

12. The earphone of claim 8, wherein the flexible arm is operable to move with respect to at least a portion of the sensor when the flexible arm bends.

13. The earphone of claim 8, wherein bending of the flexible arm in response to exertion of a force on the stem changes the acute angle.

14. An earphone, comprising:
a housing, comprising:
a speaker; and
a stem extending from the speaker; and
a flexible circuit disposed in the stem and comprising:
a first circuitry section;
a second circuitry section;
a third circuitry section; and
a fourth circuitry section;
wherein the flexible circuit is operable to flex to allow:
the first circuitry section to move toward the second circuitry section or the third circuitry section to move toward the fourth circuitry section when a force is applied to the stem; and
the first circuitry section to move away from the second circuitry section when the force is no longer applied; and
a controller, disposed in the housing, that is operative to determine an input using a change in capacitance detected using the first circuitry section and the second circuitry section or the third circuitry section and the fourth circuitry section.

15. The earphone of claim 14, wherein the controller determines the input using both the first circuitry section and the second circuitry section and the third circuitry section and the fourth circuitry section.

16. The earphone of claim 14, wherein the controller determines an amount of time that the force is applied.

17. The earphone of claim 14, wherein the controller determines an amount of the force.

18. The earphone of claim 14, further comprising a deformable member to which the flexible circuit is coupled.

19. The earphone of claim 14, wherein the flexible circuit is at least a portion of a force sensor.

20. The earphone of claim 19, further comprising a touch sensor disposed within the stem.

* * * * *